United States Patent

Otaka et al.

(10) Patent No.: US 6,582,280 B1
(45) Date of Patent: Jun. 24, 2003

(54) SANDBLASTING AGENT, WAFER TREATED WITH THE SAME, AND METHOD OF TREATMENT WITH THE SAME

(75) Inventors: Toshiaki Otaka, Nishigo-mura (JP); Teruaki Fukami, Nishigo-mura (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/555,836

(22) PCT Filed: Oct. 12, 1999

(86) PCT No.: PCT/JP99/05600

§ 371 (c)(1),
(2), (4) Date: Jun. 6, 2000

(87) PCT Pub. No.: WO00/21716

PCT Pub. Date: Apr. 20, 2000

(30) Foreign Application Priority Data

Oct. 14, 1998 (JP) ............................................. 10-292120

(51) Int. Cl.[7] .............................................. B24C 11/00
(52) U.S. Cl. .............................. 451/39; 451/38; 451/40; 252/79.1
(58) Field of Search .................... 451/38–40; 252/79.1; 148/191; 438/580, 633; 428/428; 437/10

(56) References Cited

U.S. PATENT DOCUMENTS

| | | | |
|---|---|---|---|
| 3,929,529 A | * 12/1975 | Poponiak | .................... 148/191 |
| 5,051,375 A | * 9/1991 | Sakata et al. | .................. 437/10 |
| 5,593,339 A | 1/1997 | Yam et al. | |
| 5,634,982 A | 6/1997 | Jocher | |
| 5,662,769 A | * 9/1997 | Schonauer et al. | .......... 438/633 |
| 5,738,942 A | * 4/1998 | Kubota et al. | .............. 428/428 |
| 5,884,440 A | * 3/1999 | Kubo et al. | ................. 52/167.7 |
| 6,136,218 A | * 10/2000 | Skrovan et al. | ............. 252/79.1 |
| 6,245,650 B1 | * 6/2001 | Watanabe | .................... 438/580 |

FOREIGN PATENT DOCUMENTS

| | | |
|---|---|---|
| JP | 57-21268 | 2/1982 |
| JP | 4-59770 | 9/1992 |
| JP | 6-41773 | 2/1994 |
| JP | 2571900 | 1/1997 |

* cited by examiner

Primary Examiner—George Nguyen
(74) Attorney, Agent, or Firm—Snider & Associates; Ronald R. Snider

(57) ABSTRACT

A silicon wafer is sand blasted using a sand blasting abrasive material containing a chelating agent which is selected from the group consisting of, for example, the following compounds (1) to (4) and salts thereof:

(1) Nitrilotriacetic acid (NTA)
(2) Ethylenediaminetetraacetic acid (EDTA)
(3) Diethylenediamine-N,N,N",N"-pentaacetic acid (DTPA)
(4) Cyclohexanediaminetetraacetic acid (CyDTA).

23 Claims, 1 Drawing Sheet

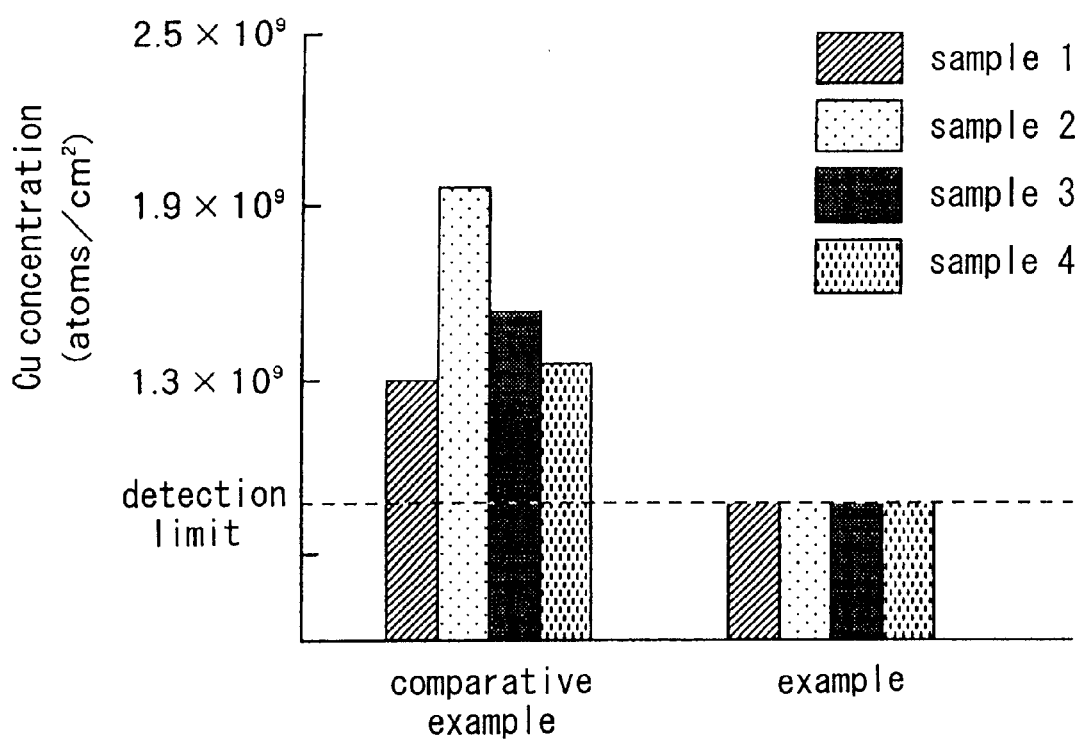

SANDBLASTING AGENT, WAFER TREATED WITH THE SAME, AND METHOD OF TREATMENT WITH THE SAME

TECHNICAL FIELD

This invention relates to a sand blasting abrasive material, a sand blasting method for a wafer using the same and a wafer processed by means of the sand blasting method.

BACKGROUND ART

There has been employed a gettering technique in a semiconductor device fabrication process by which contaminating impurities mainly including heavy metals are collected to strained sites produced outside element forming regions of a wafer in a element forming step, as means suppressing generation of crystal defects to be otherwise caused by contaminating materials on element forming surfaces of the regions.

A sand blasting method has been available as the easiest means for gettering. This method is such that a sand blasting abrasive material in the form of fine particulate is blown mainly against a rear surface opposite from an element forming surface of a wafer to create mechanically induced strain in the wafer. As the sand blasting method, two methods are adopted: one, in which natural quartz powder, synthetic quartz powder or the like powder is blown against a wafer in a powdery state without any modification thereon (a dry method) and the other, in which such powder is blown against a wafer in the form of slurry as a mixture with pure water (a wet method). It should be appreciated that as abrasive material, natural quartz powder can be used advantageously over synthetic quartz powder in that a necessary OSF (Oxidation Induced Stacking Fault) density cannot be obtained with synthetic quartz powder and in addition the synthetic quartz powder is more expensive.

As described above, while natural quartz powder is advantageous in terms of cost and so on, metal ions such as Fe ion, Ni ion, Cu ion, Zu ion, Al ion and so on, though in only trace amounts, are included therein. When a slurry is prepared adding pure water to natural quartz powder containing such metal ions, Cu ion has a low ionization tendency and is easy to deposit on a wafer surface. Further, Cu shows a high diffusion coefficient in a typical semiconductor material Si and therefore intrudes into the interior of a Si with ease, contributing very unfavorably to the Si wafer in terms of metal contamination.

When metal contamination arises, various kinds of crystal defects are induced in heat treatments of a wafer in a device fabrication process by the above described metal impurities in the bulk of the wafer. The crystal defects are also generated on a surface and in the vicinity thereof and therefore, a leakage current increases in device chips obtained from the wafer, thereby not only deteriorating device characteristics but reducing a device yield.

DISCLOSURE OF INVENTION

The invention has been made in light of such problems and it is accordingly an object of the invention to provide a sand blasting abrasive material and a sand blasting method for a wafer using the same, which prevents contamination of the wafer by a metal ion from occurring.

A sand blasting abrasive material of the invention for achieving the above object contains a chelating agent.

The chelating agent is preferably selected from the group consisting of the following compounds (1) to (4) and salts thereof:

(1) Nitrilotriacetic acid (NTA)
(2) Ethylenediaminetetraacetic acid (EDTA)
(3) Diethylenediamine-N,N,N'',N''-pentaacetic acid (DTPA)
(4) Cyclohexanediaminetetraacetic acid (CyDTA)

A molar concentration of a chelating agent described above is preferably $4.28 \times 10^{-4}$ mol/l or more and more preferably $2.57 \times 10^{-3}$ mol/l or more.

Further, a sand blasting abrasive material of the invention is preferably composed of natural quartz powder as a major component and also preferably a slurry prepared by adding natural quartz powder into pure water.

A wafer of the invention is one processed with the above described sand blasting abrasive material.

A sand blasting method for a wafer of the invention is to sand blast a wafer with the above described sand blasting abrasive material.

BRIEF DESCRIPTION OF THE DRAWINGS

FIG. 1 is a histogram showing measurement results of a Cu concentration in a silicon wafer after sand blasting, followed by heat treatment.

PREFERRED EMBODIMENTS OF INVENTION

A sand blasting abrasive material of the invention contains a chelating agent. The chelating agent forms a complex with a metal ion and therefore, when sand blasting is performed with a sand blasting abrasive material containing a chelating agent, it is prevented from occurring that a metal ion deposits on a wafer and diffuses into the bulk thereof.

A chelating agent with a high contamination preventive effect against a metal ion through formation of a stable complex with the metal ion can be selected from the group consisting of the following compounds (1) to (4) and salts thereof:

(1) Nitrilotriacetic acid (NTA) expressed by the following chemical formula 1:

(2) Ethylenediaminetetraacetic acid (EDTA) expressed by the following chemical formula 2:

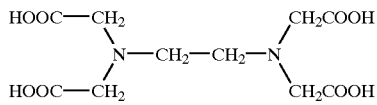

(3) Diethylenediamine-N,N,N'',N''-pentaacetic acid (DTPA) expressed by the following chemical formula 3:

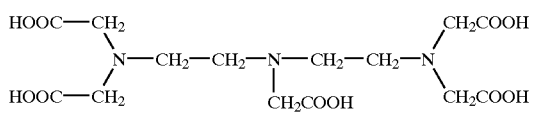

(4) Cyclohexanediaminetetraacetic acid (CyDTA) expressed by the following chemical formula 4:

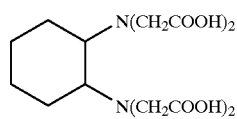

An additive amount of a chelating agent described above is preferably at molar concentration of $4.28 \times 10^{-4}$ mol/l or more and more preferably $2.57 \times 10^{-3}$ mol/l or more. If a molar concentration of a chelating agent is less than $4.28 \times 10^{-4}$ mol/l, a preventive effect against contamination by a metal impurity cannot be sufficient and therefore, the molar concentration is desirably equal to or more than the lower limit in order to ensure no residue of at least Cu ions in a slurry. The molar concentration of a chelating agent in order to ensure no residue of almost all of the metal ions including Fe ions in a slurry is desirably $2.57 \times 10^{-3}$ mol/l or more.

A sand blasting abrasive material of the invention is composed mainly of natural quartz powder and a chelating agent described above is added thereto. There can be typically named a sand blasting abrasive material prepared by adding natural quartz powder into pure water to form slurry and further adding a chelating agent above described to the slurry. Natural quartz powder is mainly composed of $SiO_2$, but as the balance, contains $Al_2O_3$, $Fe_2O_3$, $Na_2O$ and so on in trace amounts. A grain size of natural quartz powder is on the order ranging from 1 to 8 $\mu$m. In a case where a slurry is prepared using natural quartz powder, pure water is added to 1.0 kg of natural quartz powder so as to form a volume of 10.0 liters of a slurry, for example. In a method in which a wafer is sand blasted with a sand blasting abrasive material described above, for example, a silicon wafer is placed on a belt conveyor with a rear surface up and a nozzle (may be a plurality of nozzles) jetting downward a sand blasting abrasive material (slurry) described above is provided above the belt conveyor, wherein the silicon wafer is moved setting a conveyor travel speed at, say, 1.0 m/min, a nozzle position is reciprocated in a direction perpendicular to the travel direction of the conveyor in a horizontal plane in an amplitude of a wafer diameter or more at a frequency of the order of 70 cycles/min and the slurry is spurted to the rear surface of the silicon wafer at a jet pressure ranging from 0.6 to 0.9 $kg/cm^2$.

EXAMPLE (Preparation of sand blasting abrasive material)

Pure water was added to natural quartz powder of a chemical composition shown in Table 1 with a particle size distribution shown in Table 2 to prepare a slurry with a content of 1.0 kg of a natural quartz powder in 10 liters of the slurry. Ethylenediaminetetraacetic acid (hereinafter abbreviated as EDTA) as a chelating agent is added to five volumes of slurry each of 80 liters in amounts of 0.01 g, 10 g, 50 g, 60 g and 120 g, respectively, to obtain slurries with different EDTA concentrations. Residual metal ions were investigated in the slurries with different EDTA concentrations and one with no EDTA, which results are shown in Table 3.

TABLE 1

| chemical composition (wt %) | |
| --- | --- |
| $Al_2O_3$ | 0.004 |
| $SiO_2$ | 99.99 |
| $Fe_2O_3$ | 0.002 |
| $Na_2O$ | 0.002 |

TABLE 2

| grain size ($\mu$m) | ratio (%) |
| --- | --- |
| 1.00 to 1.26 | 0.0 |
| 1.26 to 1.59 | 1.3 |
| 1.59 to 2.00 | 3.0 |
| 2.00 to 2.52 | 10.1 |
| 2.52 to 3.17 | 20.0 |
| 3.17 to 4.00 | 30.3 |
| 4.00 to 5.04 | 27.0 |
| 5.04 to 6.35 | 7.4 |
| 6.35 to 8.00 | 0.9 |
| 8.00 to 10.1 | 0.0 |

TABLE 3

| EDTA (mol/l) | residual metal ion concentration in slurry (ppb) | | | | | |
| --- | --- | --- | --- | --- | --- | --- |
| | Fe ion | Ni ion | Cu ion | Zn ion | Al ion | Fe ion |
| 0 | $9.59 \times 10^3$ | $2.08 \times 10$ | $1.49 \times 10$ | $3.13 \times 10$ | $2.83 \times 10^3$ | $9.60 \times 10^3$ |
| $4.28 \times 10^{-7}$ | $1.75 \times 10^{-4}$ | $1.20 \times 10^{-11}$ | $4.09 \times 10^{-12}$ | $2.32 \times 10^{-9}$ | $6.45 \times 10^{-7}$ | 0 |
| $4.28 \times 10^{-4}$ | $1.04 \times 10^{-7}$ | 0 | 0 | 0 | 0 | |
| $2.14 \times 10^{-3}$ | $1.59 \times 10^{-8}$ | 0 | 0 | 0 | 0 | |
| $2.57 \times 10^{-3}$ | 0 | 0 | 0 | 0 | 0 | |
| $5.14 \times 10^{-3}$ | 0 | 0 | 0 | 0 | 0 | |

As shown in Table 3, in a case where an additive amount of EDTA was 10 g (at a molar concentration of $4.28 \times 10^{-4}$ mol/liter), while Fe ion remained, any of other metal ions including Cu ion was not recognized as residues. Further, in a case where an additive amount of EDTA was 60 g (at a molar concentration of $2.57 \times 10^{-3}$ mol/liter), none of other metal ions including even Fe was recognized.

(EXAMPLE)

EDTA was added to 80 liters of the slurry (before addition of EDTA) obtained in the preparation of sand blasting abrasive material in amount of 120 g to prepare an EDTA containing slurry (of a molar concentration of $5.14 \times 10^{-3}$ mol/liter). Thus obtained EDTA containing slurry was used to sand blast rear surface of p-type silicon wafers of 200 mm in diameter (the number of the sample wafers 4) and the wafers sand blasted were subjected to a heat treatment at 650° C. for 20 min.

(COMPARATIVE EXAMPLE)

A slurry with no addition of EDTA obtained in the preparation of sand blasting abrasive material was used in its original state for processing wafers (the number of the wafer samples 4) in the same conditions as in the example.

Cu concentrations were measured on surfaces of the four sample wafers in the example and in addition, surfaces of the four sample wafers in the comparative example, which results are shown in FIG. 1. In a case of sand blasting using the slurry with no EDTA, Cu contamination was recognized on all the four wafer samples, but in a case of sand blasting using the slurry with EDTA, all of Cu contamination amounts were measured to be equal to or less than a detection limit: virtually no contamination of Cu was found. Further, an OSF density which affects a gettering ability was sufficiently high and electrical characteristics such as a breakdown voltage of an oxide film were at satisfactory levels.

INDUSTRIAL APPLICABILITY

According to the invention, as described above, metal ion contamination of a wafer in sand blasting can be prevented from occurring.

What is claimed is:

1. A sand blasting abrasive material composed of natural quartz powder as a major component and containing a chelating agent, wherein the chelating agent is selected from the group consisting of:
   (1) Nitrilotriacetic acid (NTA), or a salt thereof,
   (2) Ethylenediaminetetraacetic acid (EDTA), or a salt thereof,
   (3) Diethylenediamine-N,N,N",N"-pentaacetic acid (DTPA), or a salt thereof,
   (4) Cyclohexanediaminetetraacetic acid (CyDTA), or a salt thereof, and
   (5) any combination of (1), (2), (3), and (4).

2. A sand blasting abrasive material according to claim 1, wherein a molar concentration of the chelating agent is $4.28 \times 10^{-4}$ mol/l or more.

3. A sand blasting abrasive material according to claim 1, wherein a molar concentration of the chelating agent is $2.57 \times 10^{-3}$ mol/l or more.

4. A sand blasting abrasive material according to claim 1, being a slurry prepared by adding natural quartz powder into water.

5. A wafer processed by sand blasting with a sand blasting abrasive material according to claim 1.

6. A sand blasting method for a wafer comprising the step of sand blasting with a sand blasting abrasive material according to claim 1.

7. A sandblasting material according to claim 1, wherein said chelating agent forms a complex with a metal ion contained in the natural quartz powder.

8. A sand blasting abrasive material composed of natural quartz powder as a major component and containing a chelating agent, wherein a molar concentration of the chelating agent is $4.28 \times 10^{-4}$ mol/l or more.

9. A sand blasting abrasive material composed of natural quartz powder as a major component and containing a chelating agent, wherein a molar concentration of the chelating agent is $2.57 \times 10^{-3}$ mol/l or more.

10. A sand blasting abrasive material composed of natural quartz powder as a major component and containing a chelating agent, being a slurry prepared by adding natural quartz powder into water.

11. A sand blasting method for a wafer comprising the step of sand blasting with a sand blasting abrasive material composed of natural quartz powder as a major component and containing a chelating agent.

12. An abrasive slurry for sand blasting comprising water, natural quartz powder having trace amounts of metal ions included therein and a chelating agent which forms a complex with the metal ions.

13. An abrasive slurry according to claim 12, wherein the chelating agent is selected from the group consisting of:
   (1) Nitrilotriacetic acid (NTA), or a salt thereof,
   (2) Ethylenediaminetetraacetic acid (EDTA), or a salt thereof,
   (3) Diethylenediamine-N,N,N",N"-pentaacetic acid (DTPA), or a salt thereof,
   (4) Cyclohexanediaminetetraacetic acid (CyDTA), or a salt thereof, and
   (5) any combination of (1), (2), (3), and (4).

14. An abrasive slurry according to claim 13, wherein the concentration of the chelating agent in the slurry is $4.28 \times 10^{-4}$ mol/l or more.

15. An abrasive slurry according to claim 13, wherein the concentration of the chelating agent in the slurry is $2.57 \times 10^{-3}$ mol/l or more.

16. A method for sand blasting a surface of a wafer, which comprises sand blasting said surface with an abrasive slurry according to claim 12.

17. A method according to claim 16, wherein the wafer is a silicon wafer.

18. A method for sand blasting a surface of a silicon wafer, which comprises sand blasting said surface with an abrasive slurry according to claim 13.

19. A method according to claim 18, wherein the concentration of the chelating agent in the slurry is $4.28 \times 10^{-4}$ mol/l or more.

20. A method according to claim 18, wherein the concentration of the chelating agent in the slurry is $2.57 \times 10^{-3}$ mol/l or more.

21. A sand blasted silicon wafer prepared by the method of claim 18.

22. A sand blasted silicon wafer prepared by the method of claim 19.

23. A sand blasted silicon wafer prepared by the method of claim 20.

* * * * *